United States Patent
Popp et al.

(10) Patent No.: US 7,087,492 B2
(45) Date of Patent: Aug. 8, 2006

(54) METHOD FOR FABRICATING TRANSISTORS OF DIFFERENT CONDUCTION TYPES AND HAVING DIFFERENT PACKING DENSITIES IN A SEMICONDUCTOR SUBSTRATE

(75) Inventors: Martin Popp, Dresden (DE); Lars Heineck, Dresden (DE)

(73) Assignee: Infineon Technologies AG, Munich (DE)

( * ) Notice: Subject to any disclaimer, the term of this patent is extended or adjusted under 35 U.S.C. 154(b) by 166 days.

(21) Appl. No.: 10/812,876

(22) Filed: Mar. 31, 2004

(65) Prior Publication Data

US 2005/0026373 A1    Feb. 3, 2005

(30) Foreign Application Priority Data

Mar. 31, 2002 (DE) ................. 103 14 595

(51) Int. Cl.
*H01L 21/4282* (2006.01)
(52) U.S. Cl. ............... 438/275; 438/243; 438/279; 438/241
(58) Field of Classification Search ............. 438/275, 438/279, 243, 241
See application file for complete search history.

(56) References Cited

U.S. PATENT DOCUMENTS

| | | | | |
|---|---|---|---|---|
| 5,057,448 A | * | 10/1991 | Kuroda | 438/241 |
| 5,225,700 A | * | 7/1993 | Smayling | 257/321 |
| 5,998,252 A | * | 12/1999 | Huang | 438/241 |
| 6,069,038 A | * | 5/2000 | Hashimoto et al. | 438/241 |
| 6,133,096 A | * | 10/2000 | Su et al. | 438/264 |
| 6,146,994 A | * | 11/2000 | Hwang | 438/633 |
| 6,235,574 B1 | * | 5/2001 | Tobben et al. | 438/241 |
| 6,284,592 B1 | * | 9/2001 | Lee | 438/241 |
| 6,326,657 B1 | | 12/2001 | Ohkawa | |
| 6,391,704 B1 | * | 5/2002 | Hong et al. | 438/241 |
| 6,506,647 B1 | | 1/2003 | Kuroda et al. | |
| 6,624,019 B1 | * | 9/2003 | Kim | 438/241 |
| 6,933,195 B1 | * | 8/2005 | Lee | 438/258 |
| 2005/0026373 A1 | * | 2/2005 | Popp et al. | 438/275 |

* cited by examiner

*Primary Examiner*—Laura M. Schillinger
(74) *Attorney, Agent, or Firm*—Slater & Matsil, L.L.P.

(57) ABSTRACT

A gate electrode layer is doped in a first section of a semiconductor substrate. By means of a patterning, encapsulated gate electrodes emerge from the gate electrode layer, which gate electrodes are arranged in a high packing density in a first section and are assigned to selection transistors of memory cells, and are arranged in a low packing density in a second section and are assigned to transistors of logic circuits. After a processing of the selection transistors, the encapsulated gate electrodes are uncovered in the second section and are subsequently doped in the same way in each case simultaneously with the respectively assigned source/drain regions. Together with a subsequent siliciding of the gate electrodes and of the source/drain regions, the performance of the transistors in the second section is significantly increased with little additional outlay.

13 Claims, 12 Drawing Sheets

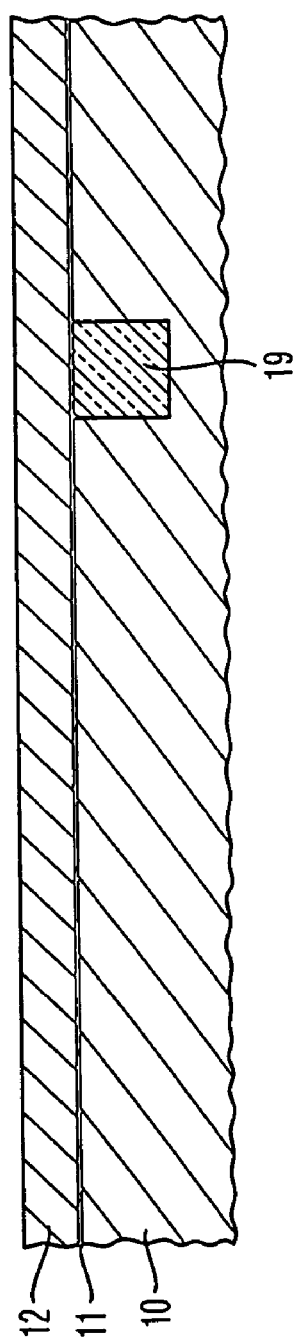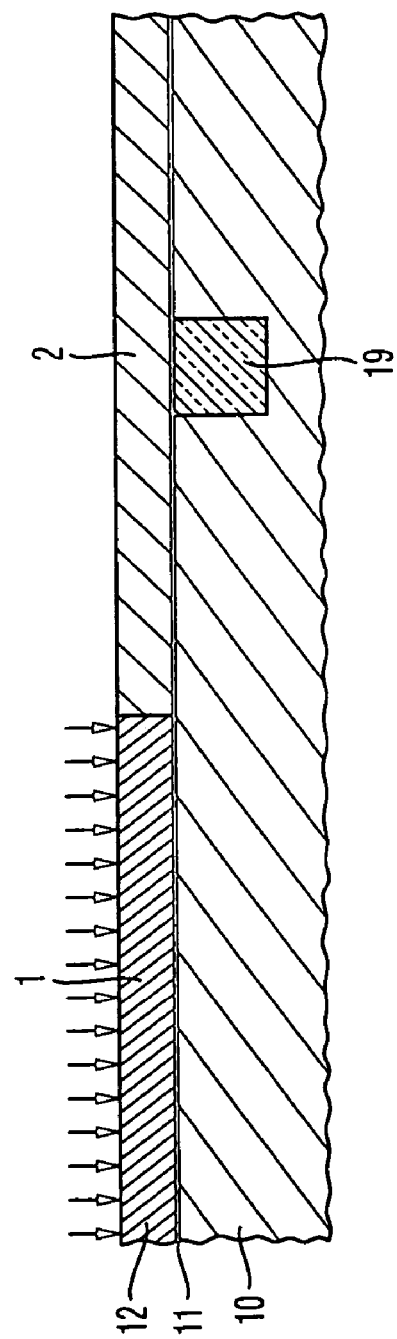

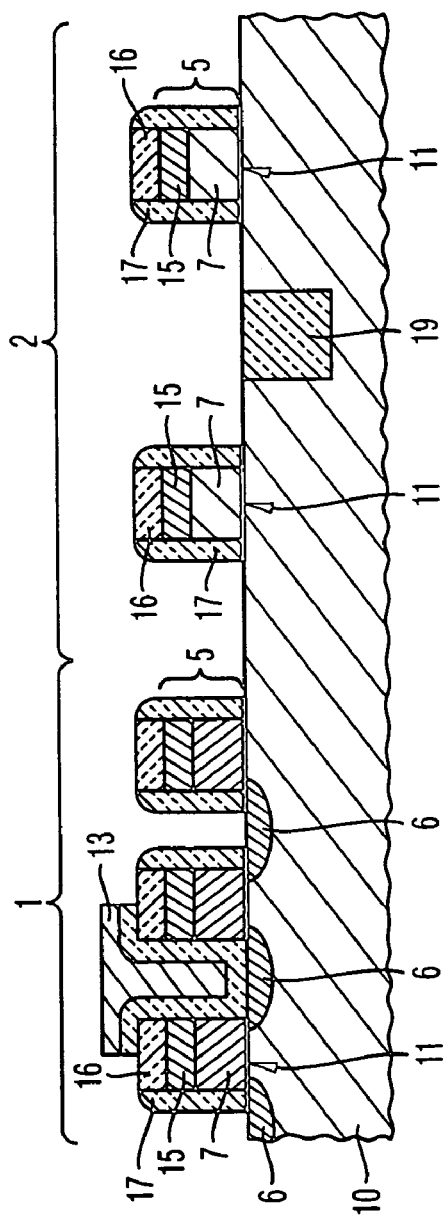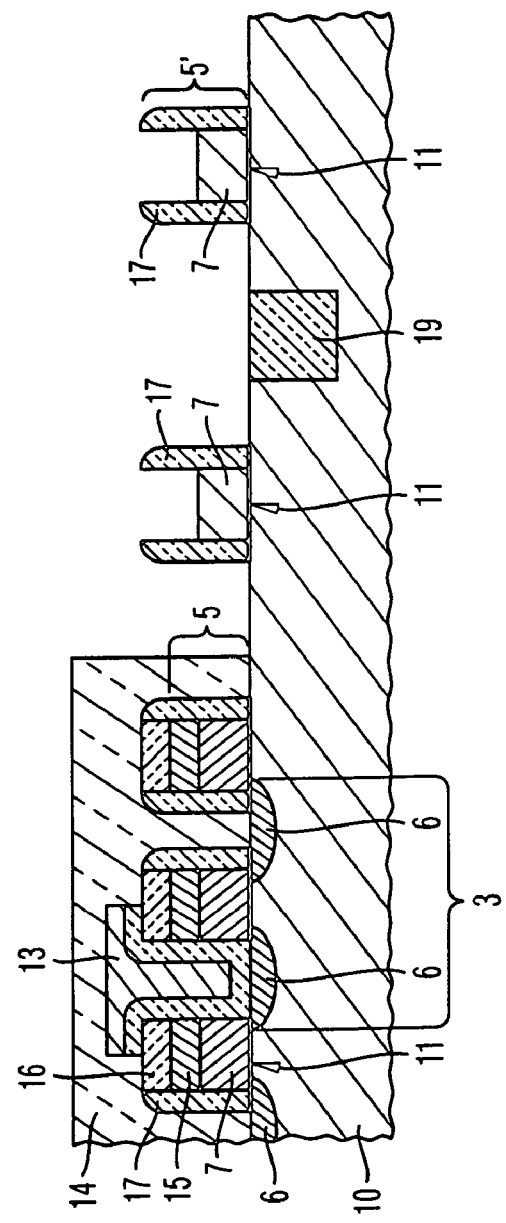
FIG 2C
FIG 2D

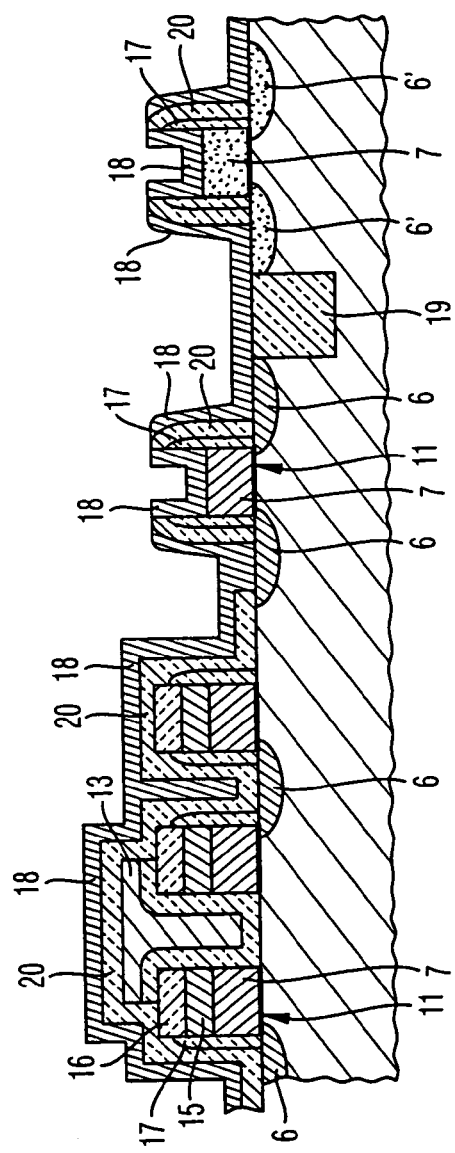
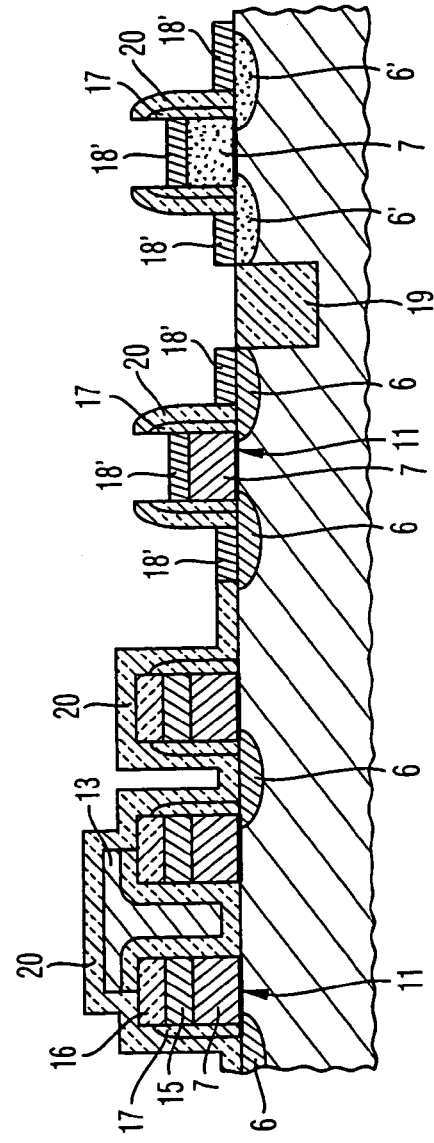
FIG 4H
FIG 4I

METHOD FOR FABRICATING TRANSISTORS OF DIFFERENT CONDUCTION TYPES AND HAVING DIFFERENT PACKING DENSITIES IN A SEMICONDUCTOR SUBSTRATE

BACKGROUND

1. Field

The invention relates to a method for fabricating transistors of different conduction types arranged in a first section of a surface of a semiconductor substrate with a high packing density and in a second section with a low packing density.

2. Background Information

New generations of DRAM (Dynamic Random Access Memory) modules for storing data in data processing devices are required to have, in conjunction with smaller dimensions, a higher number of memory cells and thus an increasing storage density. A memory cell in each case comprises a storage capacitance for storing an electrical charge that defines a respective data content of the memory cell, and a selection transistor for selectively addressing the storage capacitance.

A high storage density requires memory cells with self-aligning contacts. Self-aligning contacts are customarily embodied by encapsulating gate electrodes of the selection transistors with a dielectric before the formation of the self-aligning contacts.

One example of such a process implementation is illustrated in FIG. 1. In this case, a first dielectric layer 11, from which a gate dielectric emerges, is provided on a semiconductor substrate 10, and an n-doped gate electrode layer 12 is provided on the first dielectric layer 11. The n-doped gate electrode layer 12 is provided with a contact layer 15.

FIG. 1a shows a resultant layer stack with the contact layer 15 arranged on the gate electrode layer 12, which contact layer may comprise a silicide layer, or a metal layer in connection with a barrier layer. The first dielectric layer 11 serving as a gate dielectric is formed between the gate electrode layer 12 and the semiconductor substrate 10.

A dielectric layer used as a hard mask is subsequently deposited onto the layer stack. Afterward, the layer stack is patterned by means of a lithographic method. Gate structures 5 assigned to a respective transistor are produced. The gate structures 5 are encapsulated with a second dielectric layer 16.

FIG. 1b illustrates a plurality of gate structures 5. Gate electrodes 7 have emerged from the gate electrode layer 12, said gate electrodes in each case being provided with a contact layer 15. The gate structures 5 are in each case encapsulated with a second dielectric layer 16. In a first section 1 of the semiconductor substrate 10, in which a memory area of a DRAM module is formed, the gate structures 5 are arranged closely adjacent with a high packing density and are to be assigned to transistors 3 formed as selection transistors of memory cells. In a second section 2, the gate structures 5 are arranged at a greater distance from one another with a high packing density and are assigned to transistors 5, 5' of logic circuits, for instance for signal conditioning and addressing.

FIG. 1c illustrates, in the second section 2, n-conducting transistors 3 after an n-doping of respectively assigned source/drain regions 6 and p-conducting transistors 3' after a p-doping of assigned source/drain regions 6'.

With this type of process implementation, the way in which the gate electrodes are fabricated is disadvantageous because it has the effect that the gate electrodes always have the same doping type irrespective of a conduction type of the transistor. Thus the example of FIG. 1 provides both n-conducting and p-conducting transistors with n-doped gate electrodes. What is disadvantageous about such a transistor type is a poor scalability and a lower performance compared with a p-conducting transistor with a p-doped gate electrode.

Thus, the so-called DWF (Dual Work Function) process, which is customary for pure logic circuits and in which source/drain regions and gate electrode of a transistor are simultaneously doped with the same dopant, cannot be integrated in the case of the conventional process implementation. For such a DWF process, the gate electrode should be uncovered at the time when the source/drain regions are doped.

A further disadvantage of the encapsulated gate structures results from the fact that it is not possible to carry out a self-aligning siliciding process (SALICIDE, Self-aligned Salicide Process) which is customary for logic circuits and in which the source/drain regions and the gate electrode of a transistor are provided with a self-aligning silicide layer for the purpose of reducing the nonreactive resistance at the contact points. In the case of a transistor for a logic circuit with high performance, the gate electrodes are not permitted to be encapsulated during the siliciding. However, dispensing with encapsulated gate electrodes makes it more difficult to effect the self-aligning contact-connection in the memory area and thus to realize a high storage density. Thus, it is possible to fabricate either DRAM modules with a high storage density and with logic circuits whose performance is restricted or else DRAM modules with logic circuits having a high performance but a low storage density.

One possibility for avoiding the disadvantages of a common processing of logic area and memory area is described in U.S. Pat. No. 6,287,913. In this case, logic area and memory area are processed independently of one another. Firstly the memory area is processed and subsequently provided with a protective layer. The logic area is then processed. However, this procedure requires almost twice the number of process steps compared with the processing described in the introduction. Therefore, this is expensive and time-consuming.

SUMMARY

Accordingly, methods are described for fabricating transistors arranged in a memory area of a semiconductor substrate with a high packing density and in a logic area with a low packing density, in which, in a simple manner, the transistors arranged in the logic area are formed with unrestricted performance independently of a conduction type.

A method is described for fabricating transistors of different conduction types arranged in a first section of a surface of a semiconductor substrate with a high packing density and in a second section with a low packing density. A gate electrode having a doping of a first conduction type is provided on the semiconductor substrate at least in the first section. Encapsulated gate structures assigned to the transistors are produced in the first and second sections, the gate structures having gate electrodes emerging from the gate electrode layer and cover structures emerging from a second dielectric layer provided above the gate electrode layer. A spacer structure perpendicular to the surface of the semiconductor substrate and comprising a third dielectric layer is provided for the encapsulation of the gate structures, the gate structure sections of the second dielectric layer which are formed as a cover structure remaining in the gate structures during the formation of the spacer structures and the cover structure and the spacer structure comprising materials that can be removed selectively with respect to one another. The encapsulated gate structures are used as a protective mask and/or conductive structure for auxiliary structures for a self-aligning contact-connection of the transistors in the first section. A protective layer is applied in the region of the first section. Encapsulated gate structures arranged in the second section are opened by selective removal of the cover structures, thereby uncovering at least a portion of the gate electrodes. In each case, the gate electrode and assigned source/drain regions of at least a first subset of transistors arranged in the second section are simultaneously doped with a dopant for a second conduction type opposite to the first conduction type, so that in each case the source/drain regions and the gate electrode of a transistor arranged in the second section are provided in each case with a doping of the same conduction type.

The invention is explained in more detail below with reference to diagrammatic drawings on the basis of preferred exemplary embodiments of the methods according to the invention.

BRIEF DESCRIPTION OF THE DRAWINGS

The invention is explained in more detail below with reference to the figures, identical reference symbols being used for equivalent components. In the figures:

FIGS. 2A–2H illustrate a diagrammatic cross section through a semiconductor substrate in different process stages of transistors processed according to a first exemplary embodiment of the method according to the invention.

FIGS. 4A–4I illustrate a diagrammatic cross section through a semiconductor substrate in different process stages of transistors processed according to a third exemplary embodiment of the method according to the invention.

DETAILED DESCRIPTION

Figure 1A:
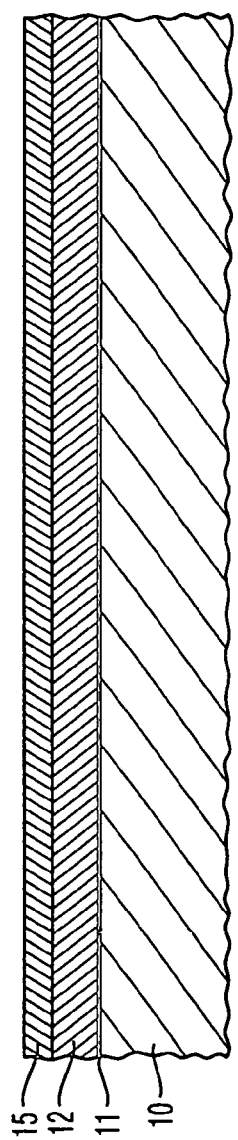
FIGS. 1A–1C illustrate a diagrammatic cross section through a semiconductor substrate in three different process stages of a processing of transistors according to a known type.
Figure 1B:
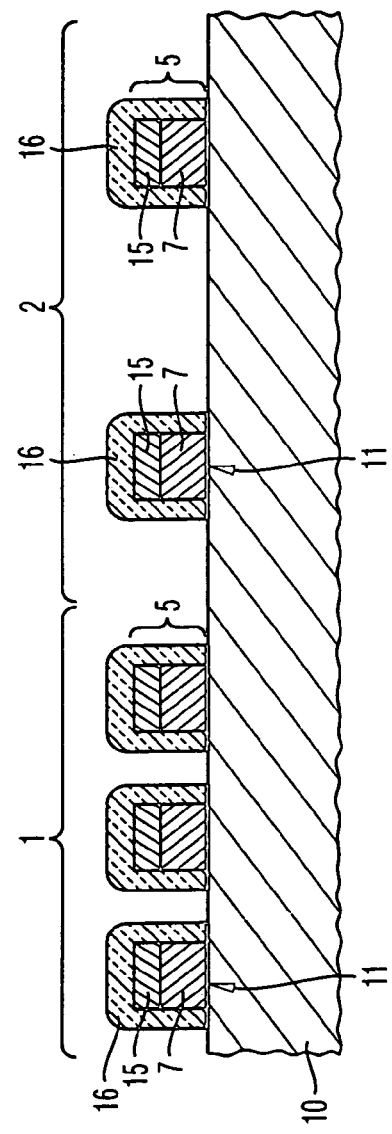
Figure 1C:
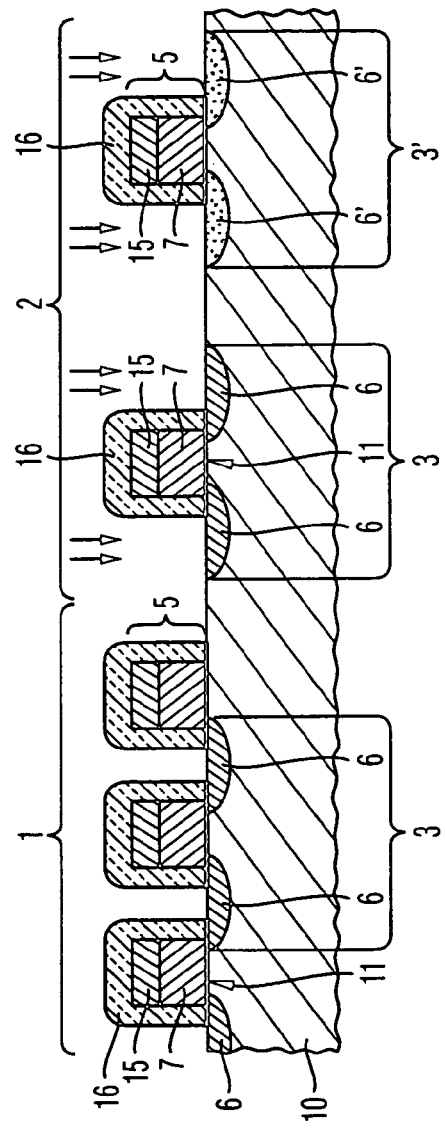

The following reference symbols as listed below are used consistently throughout the discussion of the figures:

| | |
|---|---|
| 1 | First section |
| 2 | Second section |
| 3 | n-conducting transistor |
| 3' | p-conducting transistor |
| 5 | Gate structure |
| 5' | Opened gate structure |
| 6 | Source/drain region first conduction type |
| 6' | Source/drain region second conduction type |
| 7 | Gate electrode |
| 10 | Semiconductor substrate |
| 11 | First dielectric layer |
| 12 | Gate electrode layer |
| 13 | Auxiliary structure |
| 14 | Protective layer |
| 15 | Contact layer |
| 16 | Second dielectric layer |
| 17 | Third dielectric layer |
| 18 | Metal |
| 18' | Silicide |
| 19 | Isolation trench |
| 20 | Fourth dielectric layer |

Embodiments of the present invention will be described in detail below with reference to the accompanying drawings.

In the case of the exemplary embodiment of the method according to the invention that is illustrated diagrammatically with reference to FIG. 2, firstly a first dielectric layer 11 is applied to a semiconductor substrate 10, gate dielectrics being formed from said dielectric layer in the further course of the method. A gate electrode layer 12, for instance made of polysilicon, is deposited on the first dielectric layer 11.

FIG. 2a illustrates a resultant layer system comprising the semiconductor substrate 10, the gate electrode layer 12 and the first dielectric layer 11 situated in between. An isolation trench 19 that is likewise illustrated was introduced before the layer system was even produced.

Afterward, in this exemplary embodiment, as illustrated diagrammatically in FIG. 2b, the gate electrode layer 12 is n-doped in a first section 1. In this case, the gate electrode layer 12 is covered by a blocking mask in the second section 2 and remains undoped.

A contact layer 15, for instance tungsten silicide, is provided on the gate electrode layer 12 doped in sections. Afterward, a second dielectric layer 16 is applied on the contact layer 15, said second dielectric layer emerging for instance from a TEOS (tetraethyl orthosilane) oxide. The resultant layer system is then patterned by means of a lithographic method, gate structures 5 emerging from the layer system on the semiconductor substrate 10. Vertical sidewalls of the gate structures 5 are covered with spacer structures which, using known technology, emerge from a third dielectric layer 17 and comprise a nitride, for instance. A doping process is then controlled in the first section 1 of the semiconductor substrate 10, during which doping process n-doped source/drain regions 6 are formed between the gate structures 5 in the semiconductor substrate 10. Afterward, auxiliary structures 13, for instance made of polysilicon, are provided for a self☐aligning contact-connection in the first section 1.

FIG. 2c shows the gate structures 5 completely encapsulated by residual sections of the second dielectric layer 16 and the spacer structures. The gate structures 5 are arranged in the first section 1—assigned to a memory area—with a high packing density and are arranged in the second section 2—assigned to a logic area—with a low packing density. They each have sections of a first dielectric layer 11, a gate electrode 7 and a contact layer 15. The gate electrodes 7 of gate structures 5 arranged in the first section 1 are n-doped. The encapsulated gate structures 5 form a conductive structure for the auxiliary structures 13.

The first section 1 is subsequently covered with a protective layer 14, for instance a borophosphosilicate glass (BPSG). During the further processing, the protective layer 14 protects the first section 1 from a processing relating to the second section 2. In the second section 2, the encapsulated gate structures 5 are opened, firstly the residual sections of the second dielectric layer 16 being removed selectively with respect to the spacer structures comprising the third dielectric layer 17 and then the contact layer 15 being removed.

FIG. 2d illustrates opened gate structures 5', which in each case comprise sections of the first dielectric layer 11 and the undoped gate electrode 7. The gate structures 5 arranged in the first section 1 are covered by the protective layer 14.

Figure 2E:
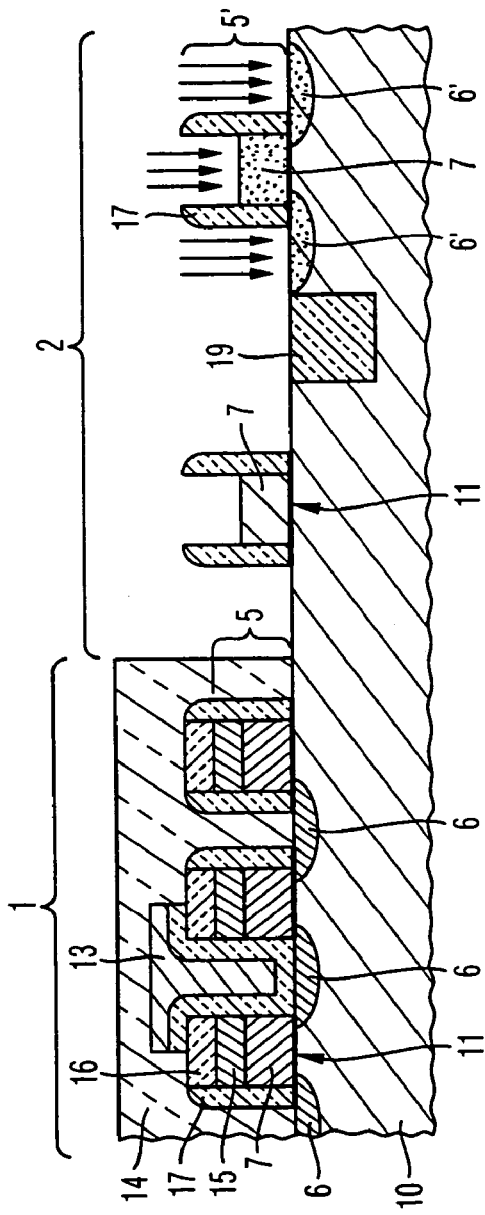

As indicated diagrammatically in FIG. 2e, afterward, firstly a first portion of the uncovered gate electrodes 7 are simultaneously p-doped together with the respectively assigned source/drain regions 6'.

Figure 2F:
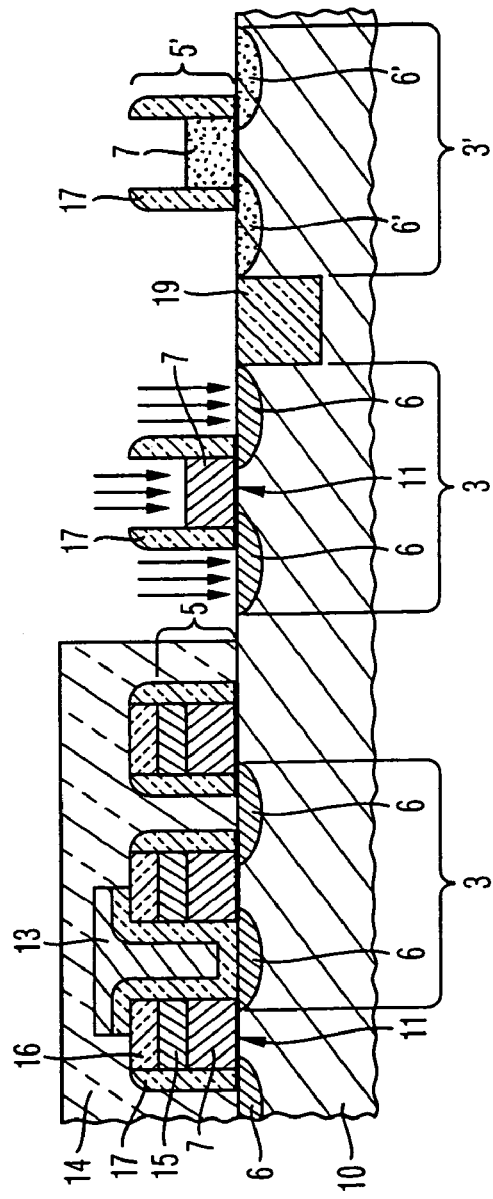

Afterward, as shown in FIG. 2f, the second portion of the gate electrodes 7 and also the respectively assigned source/drain regions 6 are simultaneously n-doped. The source/drain regions 6, 6' of mutually adjacent transistors 3, 3' are insulated from one another by the isolation trenches 19 in the semiconductor substrate 10.

Figure 2G:
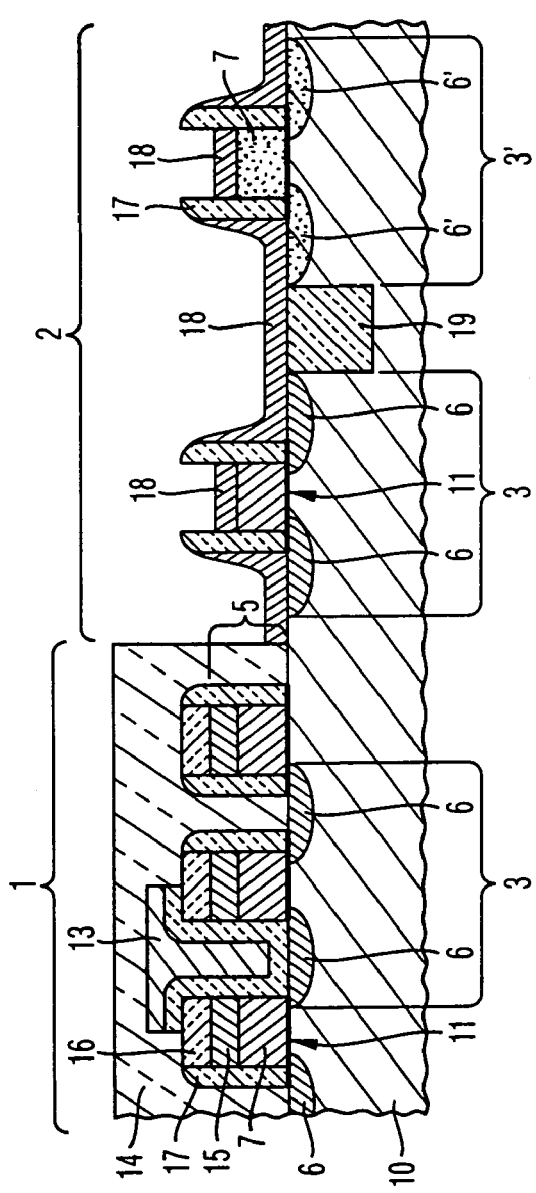

In accordance with FIG. 2g, a metal 18, for instance cobalt, is subsequently applied at least in the second section 2. By means of a thermal step, a siliciding is effected in the regions in which the metal 18 bears on silicon, that is to say on uncovered sections of the semiconductor substrate 10 and the uncovered gate electrodes 7. The silicide 18' formed in the process is formed only on the source/drain regions 6, 6' and the gate electrodes 7 in the second section 2. The siliciding is therefore self-aligning. Excess metal 18 is removed from the surface by means of an etching process.

Figure 2H:
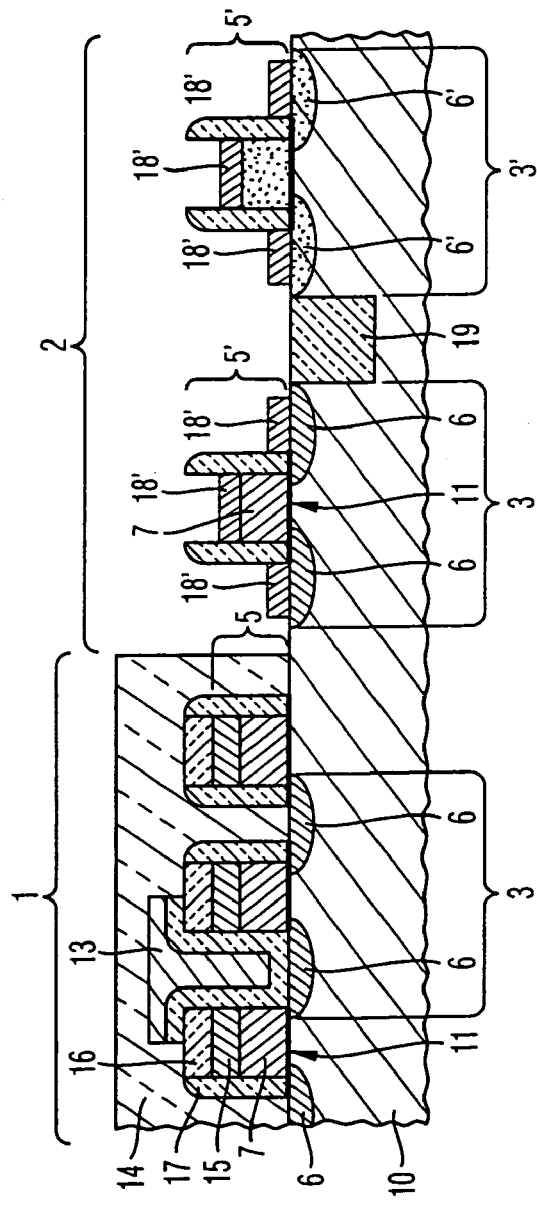

The distribution of the silicide 18' after the self☐aligning siliciding is illustrated in FIG. 2h. The silicide 18' covers the source/drain regions 6, 6' and the gate electrodes 7 of transistors 3, 3' formed in the second section 2. The silicide 18' reduces the nonreactive resistance of leads to the gate electrodes 7 or to the source/drain regions 6, 6' and thereby increases the performance of transistors 3, 3' arranged in the second section.

A variant of the method described is illustrated as a second exemplary embodiment of the method according to the invention in FIG. 3.

Figure 3A:
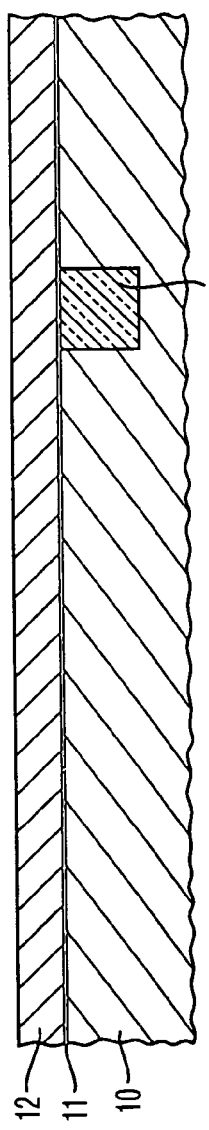
FIGS. 3A–3F illustrate a diagrammatic cross section through a semiconductor substrate in different process stages of transistors processed according to a second exemplary embodiment of the method according to the invention.

In this case, in accordance with FIG. 3a, firstly a first dielectric layer 11 is applied on a semiconductor substrate 10 and a gate electrode layer 12 is applied to the first dielectric layer 11.

Figure 3B:
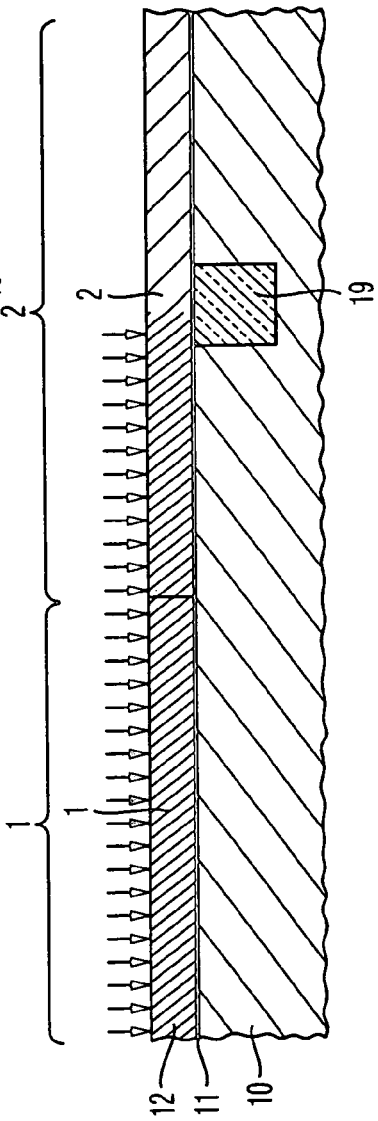

In accordance with FIG. 3b, afterward, in contrast to the first exemplary embodiment described above, not only the first section 1 but also a first partial region of the second section 2 are doped with a dopant of the first conduction type. In this case, transistors 3 of the same conduction type as the transistors 3 of the first section 1 are subsequently formed in the first partial region of the second section 2.

Figure 3C:
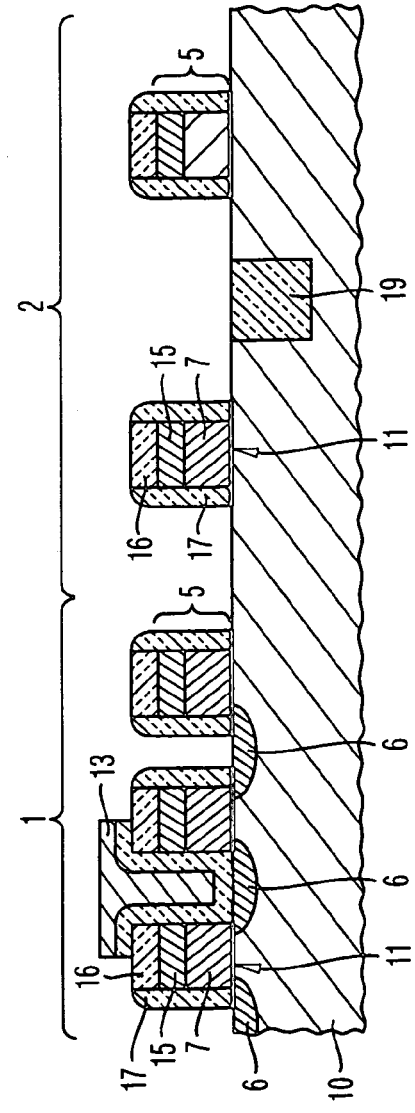
Figure 3D:
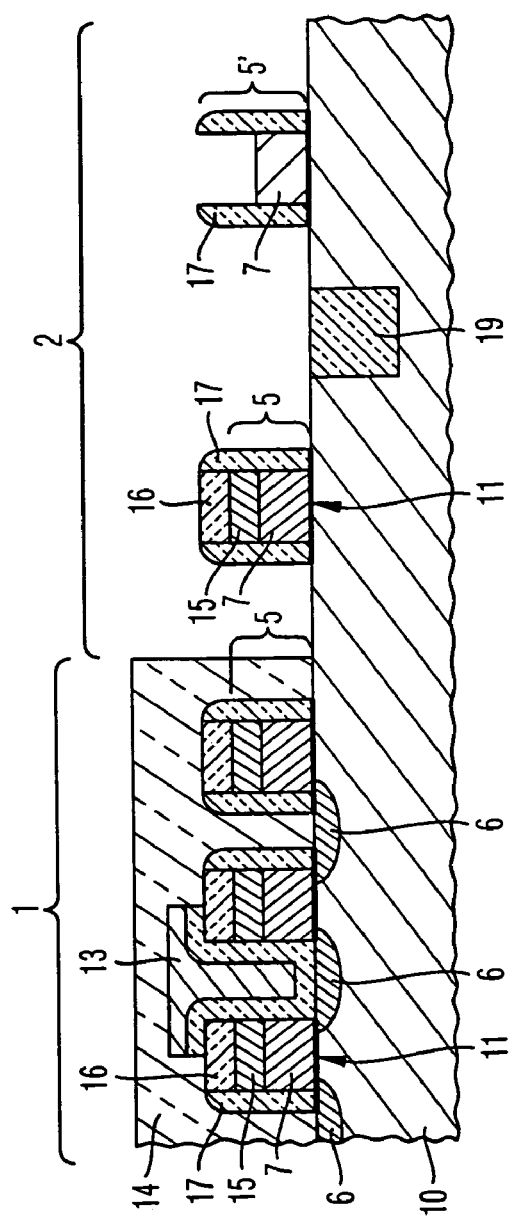
Figure 3E:
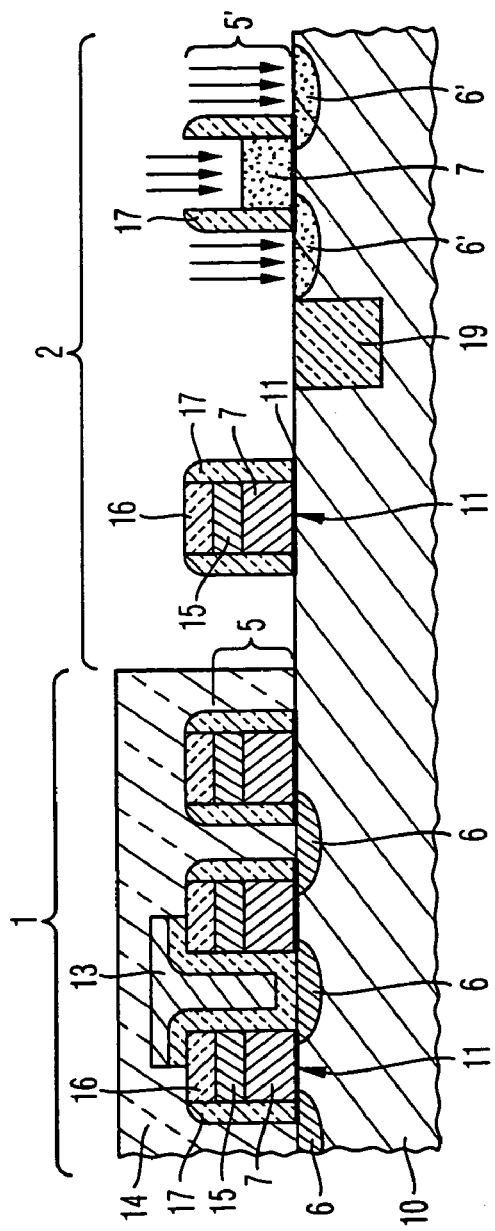

The following processing illustrated with reference to FIG. 3c to FIG. 3e largely corresponds to the procedure already described with reference to FIG. 2c to FIG. 2e, with the difference that the opening of encapsulated gate structures 5 provided for n-conducting transistors 3 is obviated in the second section 2 since the assigned gate electrodes 5 are already n-doped and silicided.

Figure 3F:
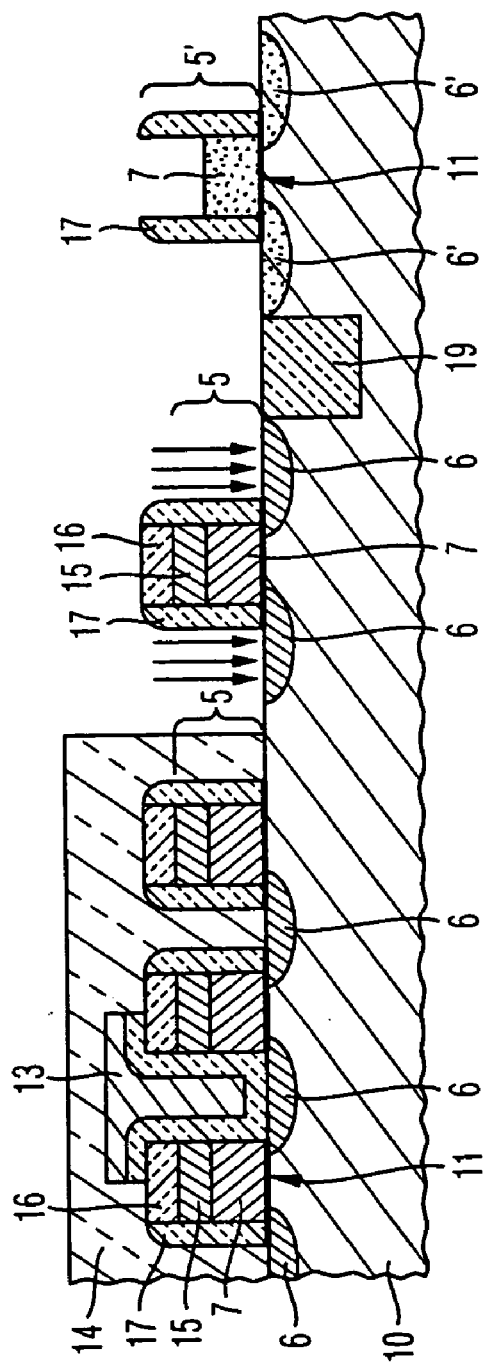

As is further shown in FIG. 3f, the source/drain regions 6 of the n-conducting transistors 3 arranged in the second section are subsequently n-doped. All gate electrodes 7 provided with a dopant of the first conduction type are doped in a single process step. The opening of a portion of the gate structures 5 in the second section 2 is obviated. Only a portion of the gate structures 5 are opened in the second section 2.

FIG. 4 illustrates the method according to the invention on the basis of a third exemplary embodiment.

Figure 4A:
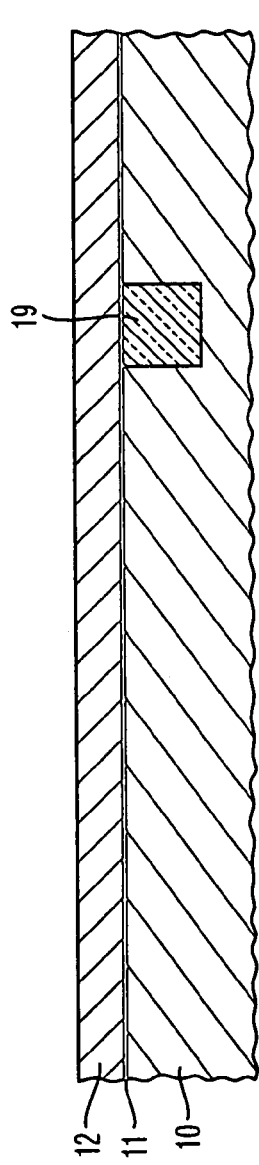

In this case, as illustrated in FIG. 4a, firstly isolation trenches 19 are provided in the semiconductor substrate 10. The first dielectric layer 11 is applied on the semiconductor substrate 10 and the first gate electrode layer 12 is applied to the first dielectric layer 11.

Figure 4B:
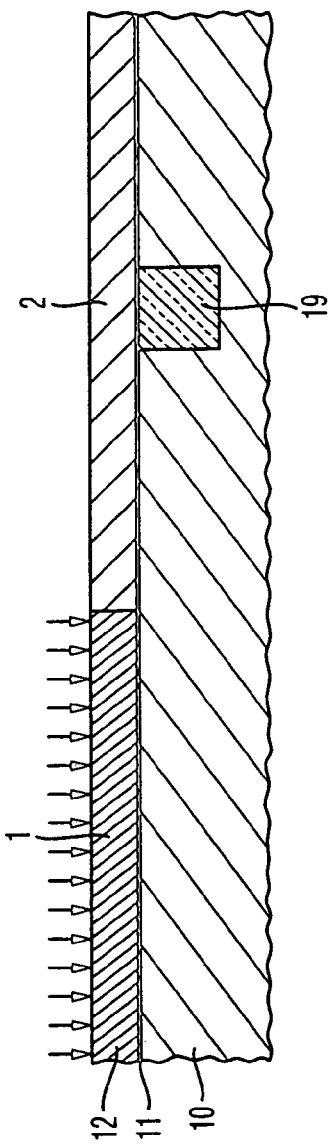

In accordance with FIG. 4b, the gate electrode layer 12 is doped with a dopant of the first conduction type, with an n-conducting type in this exemplary embodiment, in a first section 1 and remains undoped in a second section 2.

After the application of a contact layer 15 and a second dielectric layer 16, which comprises a nitride, the gate structures 5 are formed by means of an etching process. A third dielectric layer 17, for instance a TEOS oxide, is then deposited. The third dielectric layer 17 is patterned in such a way that vertical sidewalls of the gate structures 5 and partial sections provided for the self☐aligning contact-connection on the semiconductor substrate 10 are covered. Furthermore, the source/drain regions 6 assigned to the gate structures 5 are doped in the first section 1, those regions which are provided for the self-aligning contact-connection being spared during the doping. Auxiliary structures 13 are introduced for the self-aligning contact-connection.

Figure 4C:
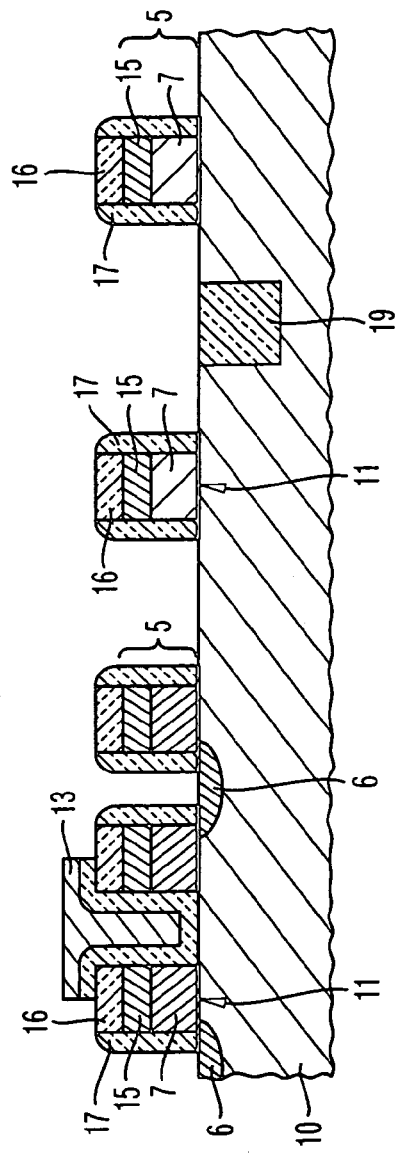

FIG. 4c reveals the encapsulated gate structures 5, 5' and also the arrangement of the auxiliary structures 13 and the n-doped source/drain regions 6 in the first section 1.

Afterward, a fourth dielectric layer 20 having a thickness of approximately 20 nm to 60 nm, preferably 40 nm, is deposited over the whole area. The fourth dielectric layer 20 is patterned in such a way that it is preserved as a protective layer in the first section 1. In the second section 2, it is removed for instance by means of an anisotropic etching, sections of the fourth dielectric layer remaining at the vertical sidewalls of the gate structures 5 in the second section 2 and reinforcing the third dielectric layer 17 at the vertical sidewalls.

Figure 4D:
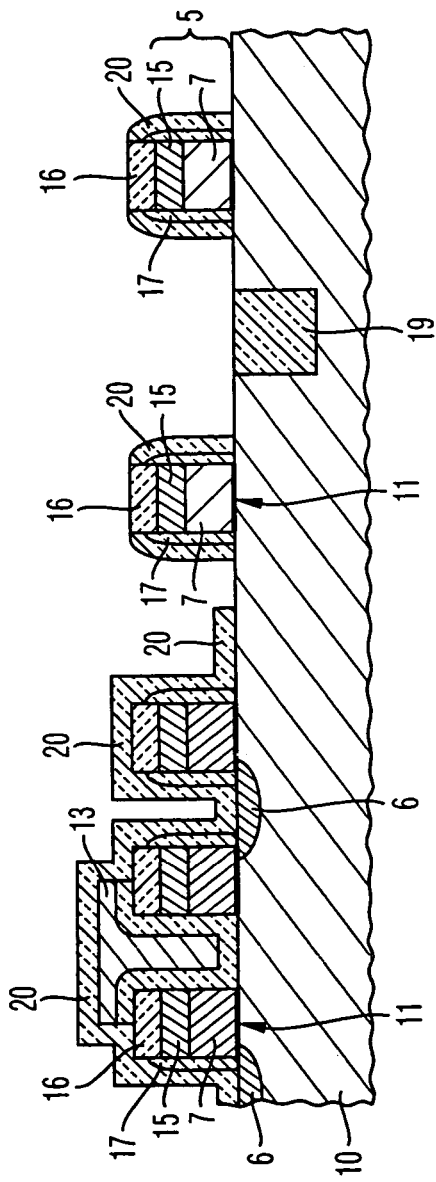
Figure 4E:
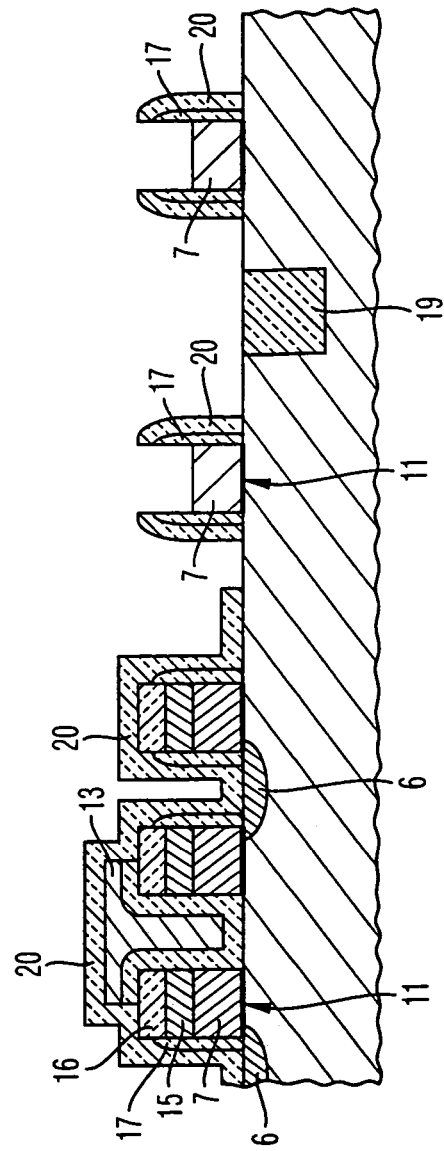
Figure 4F:
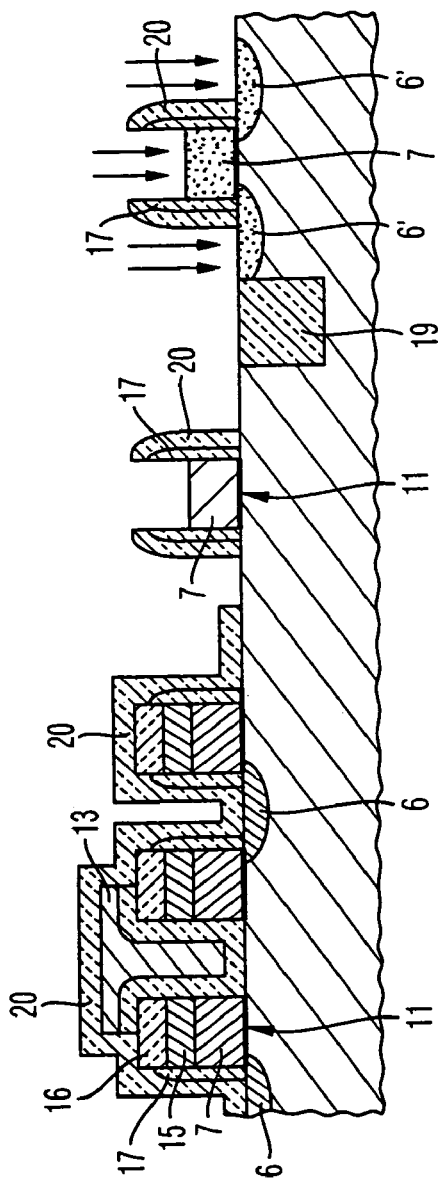
Figure 4G:
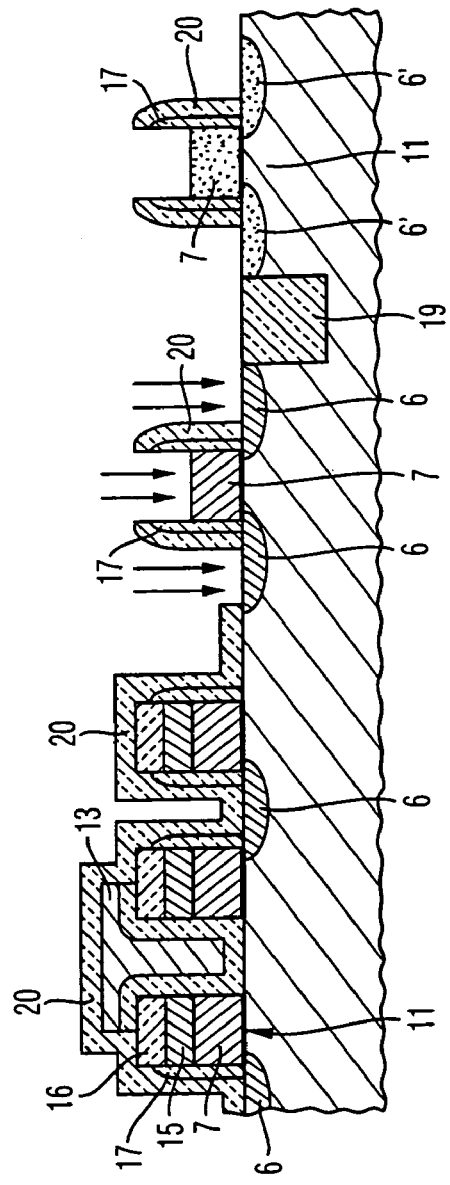

FIG. 4d illustrates the fourth dielectric layer 20 covering the first section 1. In the second section 2, sections of the fourth dielectric layer 20 reinforce the spacer structures that emerged from the third dielectric layer 17 at the vertical sidewalls of the gate structures 5.

The subsequent processing illustrated with reference to FIG. 4e to FIG. 4i largely corresponds to the procedure already described with reference to FIG. 2d to FIG. 2h.

In the case of this exemplary embodiment, the single application of the fourth dielectric layer is utilized in two respects. Firstly, the fourth dielectric layer 20 protects structures formed in the first section 1 before the processing relating to the second section 2. Secondly, the spacer structures are reinforced in the second section 2.

Therefore, the method according to the invention is used to fabricate transistors of different conduction types which are arranged in a first section of a surface of a semiconductor substrate with a high packing density and in a second section of the semiconductor substrate with a low packing density. In this case, firstly a gate electrode layer is provided on the semiconductor substrate, which gate electrode layer, according to the invention, is doped with a dopant for a first conduction type at least in a first section. Afterward, encapsulated gate structures assigned to the transistors are produced in the first and second sections, gate electrodes emerging from the gate electrode layer.

According to embodiments of the invention, a spacer structure which is perpendicular to the surface of the semiconductor substrate and comprises a third dielectric layer, and a cover structure which is horizontal with respect to the surface of the semiconductor substrate and comprises a second dielectric layer are provided for the encapsulation of the gate structures, the spacer structure and the cover structure comprising materials that can be removed selectively with respect to one another. In this case, the encapsulated gate structures serve as a protective mask and/or conductive structure for auxiliary structures for forming a self-aligning contact-connection of the transistors in the first section. By means of the encapsulation, the gate electrodes are additionally insulated from contact structures. After the application of the auxiliary structures, a protective layer is applied in the region of the first section, and protects the first section from further process steps relating to the second section.

In accordance with exemplary methods in accordance with the invention, the encapsulated gate structures arranged in the second section are at least partly opened again by selective removal of the cover structures. At least a portion of the gate electrodes is uncovered in this case. For at least a first subset of transistors arranged in the second section, in each case the gate electrode and assigned source/drain regions are simultaneously doped with a dopant for a second conduction type opposite to the first conduction type, so that the source/drain regions and the gate electrodes of a transistor in the second section are in each case provided with a doping of the same conduction type.

Methods described in accordance with the invention affords a plurality of advantages. By virtue of the gate electrode layer being doped in sections prior to patterning, it is subsequently possible to fabricate the gate structures in the two sections jointly in the same way, n-conducting transistors with n-doped gate electrodes and p-conducting transistors with p-doped gate electrodes advantageously being formed. This significantly increases the performance of the transistors in the second section with a low additional outlay on simple and noncritical process steps.

As a result of opening the previously encapsulated gate structures provided with an undoped gate electrode layer, it is possible to integrate a dual work function process in which the gate electrode and the source/drain regions of a transistor are simultaneously doped with the same dopant. A low performance p-conducting transistor with an n-doped gate electrode is thus replaced by a high performance p-conducting transistor with a p-doped gate electrode.

Before the application of the partly doped gate electrode layer, firstly a first dielectric layer is provided on the surface of the semiconductor substrate. The gate electrode layer is applied to the first dielectric layer and is subsequently doped with a dopant for the first conduction type at least in the first section.

In a first embodiment of the method according to the invention, the gate electrode layer is doped with the dopant for the first conduction type exclusively in the first section. Afterward, the gate electrodes of transistors of the first and second conduction types arranged in the second section are uncovered. The advantage in the case of this method is that during the doping of the first section, the second section can be covered with a simple blocking mask.

In the case of a second embodiment, the gate electrode layer is doped with the dopant for the first conduction type in the first section and in a first partial region of the second section. Afterward, only the gate electrodes of transistors to be provided of the second conduction type are uncovered in the second section. This embodiment is advantageous because only a portion of the encapsulated gate structures arranged in the second section have to be opened, namely the gate structures which are doped with a dopant for the second conduction type.

Preferably, a contact layer is provided over the whole area on the gate electrode layer doped in sections, which contact layer is removed again during the uncovering of the gate electrodes in the second section. The contact layer may comprise a silicide layer or a metal layer in connection with a barrier layer. The contact layer reduces contact or lead resistances of the gate electrodes. During the uncovering of the gate electrodes, the contact layer is removed for example by means of a selective wet etching process.

In order also to make it possible to silicide the gate electrodes or the source/drain regions of the transistors arranged in the second section, according to the invention, after the doping of the gate electrodes and the formation of the source/drain regions, a layer made of a metal is applied at least in the second section. The metal is heated, a first portion of the metal reacting in the region of the gate electrodes with a material of the gate electrode and in the region of the uncovered sections of the semiconductor substrate with a material of the semiconductor substrate to form a patterned silicide layer. A second portion of the metal, not contained in the patterned silicide layer, is removed again. This process is known as a self-aligning siliciding process (SALICIDE). The process is self-aligning because the metal is applied over the whole area and, by means of the thermal step, reacts only at the locations at which a silicide layer is provided, namely where the semiconductor substrate is uncovered. The silicided gate electrodes and source/drain regions advantageously reduce the contact resistances and thus the reaction times of the transistors.

In the second section of the semiconductor substrate, the source/drain regions of mutually adjacent transistors are isolated from one another by isolation trenches. These isolation trenches, which are introduced into the semiconductor substrate still prior to the application of the layer stack for the production of the gate structures, also have the advantage, inter alia, that the silicide forms only on the source/drain regions and on the gate electrodes.

For the encapsulation of the gate structures, a second dielectric layer is applied to the contact layer. The gate electrode layer, the contact layer and the second dielectric layer are patterned in the same way and the gate structures are formed in the process. A third dielectric layer is provided on sidewalls of the gate structures which are inclined or vertical with respect to the surface of the semiconductor substrate. The encapsulation of the gate structures is necessary in order to be able to provide a self-aligning contact connection in the first section for the densely arranged transistors. In this case, the encapsulation acts as a conductive structure for auxiliary structures and as insulation between the gate electrodes and the contact structures.

In the case of a third embodiment of the method according to the invention, a fourth dielectric layer is used as a protective layer above the first section and for patterning, in particular for widening, of the dielectric layers at the sidewalls of the gate structures in the second section.

In this case, the third dielectric layer is provided such that it additionally extends over partial sections of the first section which are provided for the self-aligning contact-connection on the semiconductor substrate. During a subsequent doping of the source/drain regions in the first section, partial sections of the semiconductor substrate which are provided for the self-aligning contact-connection are spared. Auxiliary structures for the self-aligning contact-connection are then provided in the first section. The fourth dielectric layer is then applied to the first and to the second section. The fourth dielectric layer is patterned in the second section in such a way that the third dielectric layer formed at the sidewalls of the gate structures is reinforced by the fourth dielectric layer. In the first section, the fourth dielectric layer is used as a protective layer.

In the case of this embodiment, it is advantageous that the fourth dielectric layer is utilized in two respects. Firstly, the fourth dielectric layer is used as a protective layer above the first section, thereby obviating the application and patterning of a separate protective layer above the first section. Secondly, the dielectric layers or spacer structures at the sidewalls of the gate structures are advantageously reinforced in the second section.

For the application of the separate protective layer, an etching stop layer is deposited over the whole area and the deposited etching stop layer is removed from the second section by means of a mask.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. A method for fabricating transistors of different conduction types arranged in a first section of a surface of a semiconductor substrate with a high packing density and in a second section with a low packing density, comprising:
   providing a gate electrode having a doping of a first conduction type on the semiconductor substrate at least in the first section;
   producing encapsulated gate structures assigned to the transistors in the first and second sections, the gate structures having gate electrodes emerging from the gate electrode layer and cover structures emerging from a second dielectric layer provided above the gate electrode layer;
   providing a spacer structure perpendicular to the surface of the semiconductor substrate and comprising a third dielectric layer for the encapsulation of the gate structures, the gate structure sections of the second dielectric layer which are formed as a cover structure remaining in the gate structures during the formation of the spacer structures and the cover structure and the spacer structure comprising materials that can be removed selectively with respect to one another;
   using the encapsulated gate structures as a protective mask and/or conductive structure for auxiliary structures for a self-aligning contact-connection of the transistors in the first section;
   applying a protective layer in the region of the first section;
   opening encapsulated gate structures arranged in the second section by selective removal of the cover structures, thereby uncovering at least a portion of the gate electrodes; and
   simultaneously doping, in each case, the gate electrode and assigned source/drain regions of at least a first subset of transistors arranged in the second section, with a dopant for a second conduction type opposite to the first conduction type, so that in each case the source/drain regions and the gate electrode of a transistor arranged in the second section are provided in each case with a doping of the same conduction type.

2. The method as in claim 1, wherein
   a first dielectric layer is provided on the surface of the semiconductor substrate,
   the gate electrode layer is applied to the first dielectric layer, and
   the gate electrode layer is doped with a dopant for the first conduction type at least in the first section.

3. The method as in claim 1, wherein the gate electrode layer is doped with the dopant for the first conduction type exclusively in the first section, and the gate electrodes of transistors of the first and second conduction types arranged in the second section are uncovered.

4. The method as in claim 1, wherein the gate electrode layer is provided with the dopant for the first conduction type in the first section and a first partial region of the second section, and the gate electrodes of transistors that are to be provided of the second conduction type and are arranged in the second section are uncovered.

5. The method as in claim 1, wherein a contact layer is provided on the gate electrode layer doped in sections and is removed for the purpose of uncovering the gate electrodes in the second section.

6. The method as in claim 1, wherein for the purpose of uncovering the gate electrodes, the contact layer is removed by means of a selective wet etching process.

7. The method as in claim 1, wherein after the doping of the gate electrodes and the formation of the source/drain regions,
   a layer made of a metal is applied at least in the second section,
   the metal is heated, a first portion of the metal reacting in the region of the gate electrodes with a material of the gate electrode and in the region of the uncovered sections of the semiconductor substrate with a material of the semiconductor substrate to form a patterned silicide layer and
   a second portion of the metal, not contained in the patterned silicide layer, is removed.

8. The method as in claim 1, wherein isolation trenches which isolate the source/drain regions of mutually adjacent transistors from one another are provided in the second section in the semiconductor substrate.

9. The method as in claim 1, wherein for the encapsulation of the gate structures,
   a second dielectric layer is applied to the contact layer,
   the gate electrode layer, the contact layer and the second dielectric layer are patterned and the gate structures are produced in the process, and
   a third dielectric layer is provided on sidewalls of the gate structures which are inclined or vertical with respect to the surface of the semiconductor substrate.

10. The method as in claim 9, wherein
    the third dielectric layer is provided in a manner extending over partial sections provided for the self-aligning contact-connection on the semiconductor substrate.

11. The method as in claim 1, wherein during a doping of the source/drain regions with a dopant for the first conduction type in the first section, partial sections provided for the self-aligning contact-connection on the semiconductor substrate are spared.

12. The method as in claim 1, wherein
    auxiliary structures are provided for the self-aligning contact-connection in the first section,
    a fourth dielectric layer is applied to the first and to the second section, and
    the fourth dielectric layer is patterned in the second section in such a way that the third dielectric layer formed at the sidewalls of the gate structures is reinforced by the fourth dielectric layer.

13. The method as claimed in claim 1,
    wherein for the application of the protective layer,
    an etching stop layer is deposited, and
    the etching stop layer is patterned by means of a mask in such a way that the etching stop layer is removed above the second section.

* * * * *